United States Patent
Ganser et al.

(10) Patent No.: US 11,333,527 B2
(45) Date of Patent: May 17, 2022

(54) SCREENING SYSTEM FOR MAGNETIC ROTARY-ENCODER SENSOR SYSTEM

(71) Applicant: Fritz Kübler GmbH, Villingen-Schwenningen (DE)

(72) Inventors: Christian Ganser, Mönchweiler (DE); Fred Hintz, St. Georgen (DE); Philipp Becker, Villingen-Schwenningen (DE); Viktor Steiner, Tuttlingen (DE)

(73) Assignee: Fritz Kübler GmbH, Villingen-Schwenningen (DE)

( * ) Notice: Subject to any disclaimer, the term of this patent is extended or adjusted under 35 U.S.C. 154(b) by 111 days.

(21) Appl. No.: 16/675,774

(22) Filed: Nov. 6, 2019

(65) Prior Publication Data

US 2020/0072642 A1 Mar. 5, 2020

Related U.S. Application Data

(63) Continuation of application No. 16/320,289, filed as application No. PCT/EP2018/057801 on Mar. 27, 2018.

(30) Foreign Application Priority Data

Mar. 27, 2017 (DE) .................... 10 2017 106 479.6

(51) Int. Cl.
  *G01D 5/14* (2006.01)
  *H02K 11/215* (2016.01)
  (Continued)

(52) U.S. Cl.
  CPC ............. *G01D 5/145* (2013.01); *G01R 33/07* (2013.01); *G01R 33/09* (2013.01); *H02K 11/012* (2020.08);
  (Continued)

(58) Field of Classification Search
  CPC . G01B 7/30; G01D 5/14; G01D 5/142; G01D 5/145; G01D 5/147; H02K 11/01;
  (Continued)

(56) References Cited

U.S. PATENT DOCUMENTS 3,742,243 A 6/1973 Gamble
4,053,826 A 10/1977 Wasawa
(Continued)

FOREIGN PATENT DOCUMENTS

DE 102008022369 11/2009
DE 102011012357 8/2012
(Continued)

OTHER PUBLICATIONS

International Search Report and Written Opinion for corresponding Patent Application No. PCT/EP2018/057801 dated May 15, 2018.

*Primary Examiner* — David M Schindler
(74) *Attorney, Agent, or Firm* — Renner, Otto, Boisselle & Sklar, LLP

(57) ABSTRACT

A screening system for a magnetic rotary-encoder sensor system in an environment of a machine including a magnetic noise field, wherein the rotary-encoder sensor system comprises a magnetic sensor, a pole wheel, and preferably a pole-wheel carrier, wherein the pole wheel comprises in a circumferential direction a plurality of permanent magnets of alternating magnetic polarity generating a useful field, wherein the pole-wheel carrier is configured to be mounted in a rotationally-fixed manner to a rotating machine shaft extending axially, rotational speed and/or angular position of which is to be determined by means of the rotary-encoder sensor system, wherein the magnetic sensor is positioned, in a mounted state of the rotary-encoder sensor system relative to the machine shaft, in a rotational plane of the pole wheel, which can affect the noise field, and directly opposite to the pole wheel, wherein the screening system comprises at least (Continued)

one magnetically conducting, preferably machine-fixed, deflection element being formed and dimensioned such that in the mounted state a measuring volume, which is substantially free of the noise field, is established, to which the magnetic sensor, and such ones of the permanent magnets are at least adjacent which are required for generating an evaluable useful field, when the noise field is active.

17 Claims, 11 Drawing Sheets

(51) Int. Cl.
*H02K 29/08* (2006.01)
*H02K 11/01* (2016.01)
*G01R 33/07* (2006.01)
*G01R 33/09* (2006.01)

(52) U.S. Cl.
CPC ......... *H02K 11/014* (2020.08); *H02K 11/215* (2016.01); *H02K 29/08* (2013.01)

(58) Field of Classification Search
CPC .... H02K 11/02; H02K 11/022; H02K 11/024; H02K 11/028; H02K 11/20; H02K 11/21; H02K 11/215; H02K 11/012; H02K 11/014; H02K 29/08; G01R 33/06; G01R 33/07; G01R 33/072; G01R 33/075; G01R 33/077; G01R 33/09; G01R 33/091; G01R 33/093; G01R 33/095; G01R 33/096; G01R 33/098
See application file for complete search history.

(56) References Cited

U.S. PATENT DOCUMENTS

| | | | |
|---|---|---|---|
| 8,519,700 B2 | 8/2013 | Jerance et al. | |
| 2001/0048302 A1 | 12/2001 | Kogure | |
| 2002/0089324 A1* | 7/2002 | Miyata | G01D 5/145 |
| | | | 324/207.2 |
| 2008/0284288 A1 | 11/2008 | Utsumi | |
| 2009/0146649 A1* | 6/2009 | Sato | G01D 5/14 |
| | | | 324/207.25 |
| 2012/0105057 A1 | 5/2012 | Mol | |
| 2015/0177024 A1* | 6/2015 | Carrasco | G01D 5/14 |
| | | | 324/207.25 |
| 2016/0025516 A1* | 1/2016 | Asano | G01D 5/16 |
| | | | 324/207.21 |
| 2016/0097655 A1 | 4/2016 | Hernandez-Oliver | |
| 2016/0216132 A1* | 7/2016 | Ausserlechner | G01D 5/14 |
| 2017/0108411 A1* | 4/2017 | Komuro | B62D 15/0215 |
| 2019/0312483 A1* | 10/2019 | Lee | H02K 7/063 |

FOREIGN PATENT DOCUMENTS

| | | |
|---|---|---|
| DE | 10 2012 220139 A1 | 5/2014 |
| DE | 102012220139 | 5/2014 |
| DE | 11 2013 001757 T5 | 2/2015 |
| DE | 102016002387 | 6/2016 |
| JP | 2001004405 | 12/2001 |
| WO | 2009/015496 A1 | 2/2009 |
| WO | 2017/034691 A1 | 3/2017 |

* cited by examiner

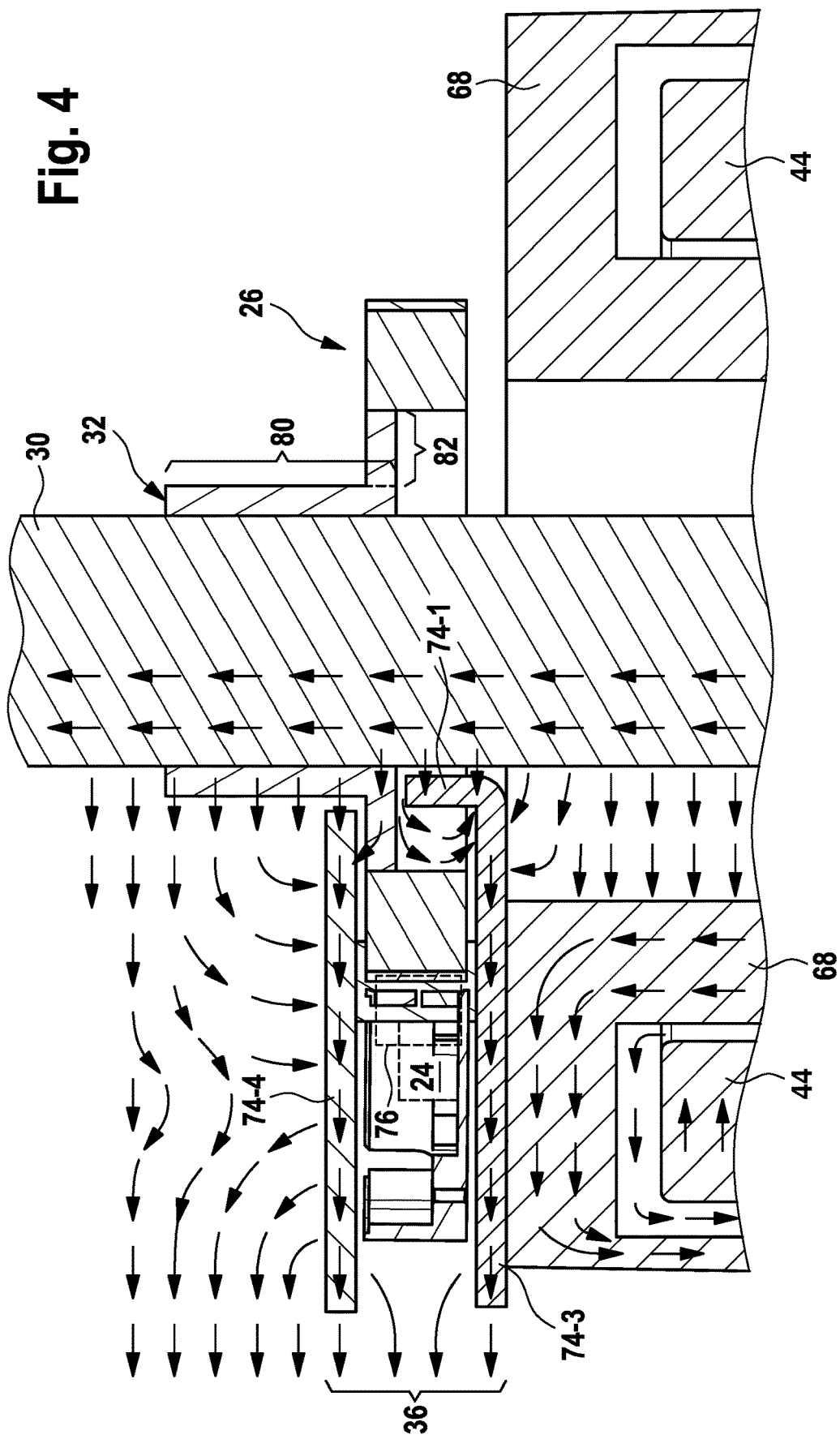

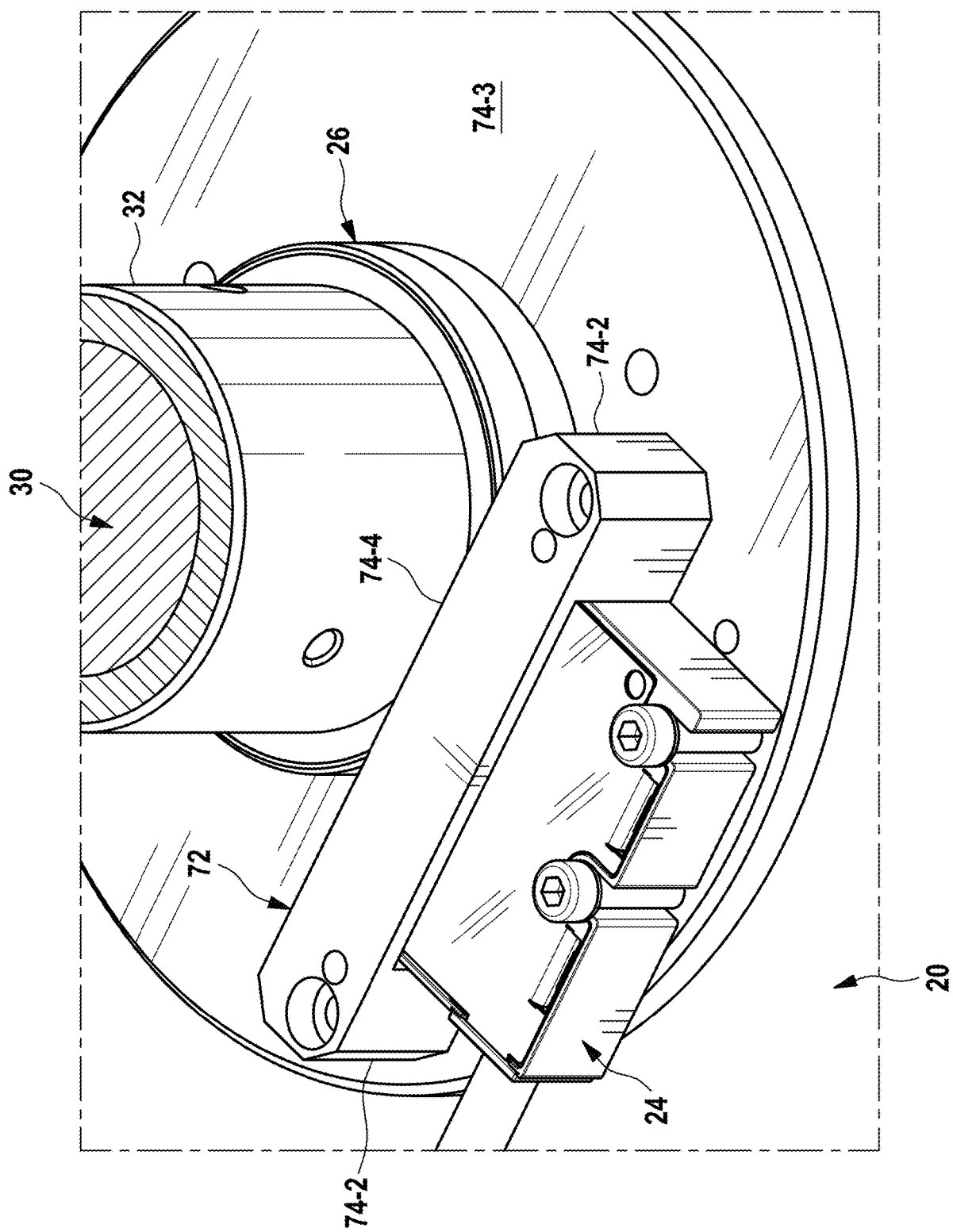

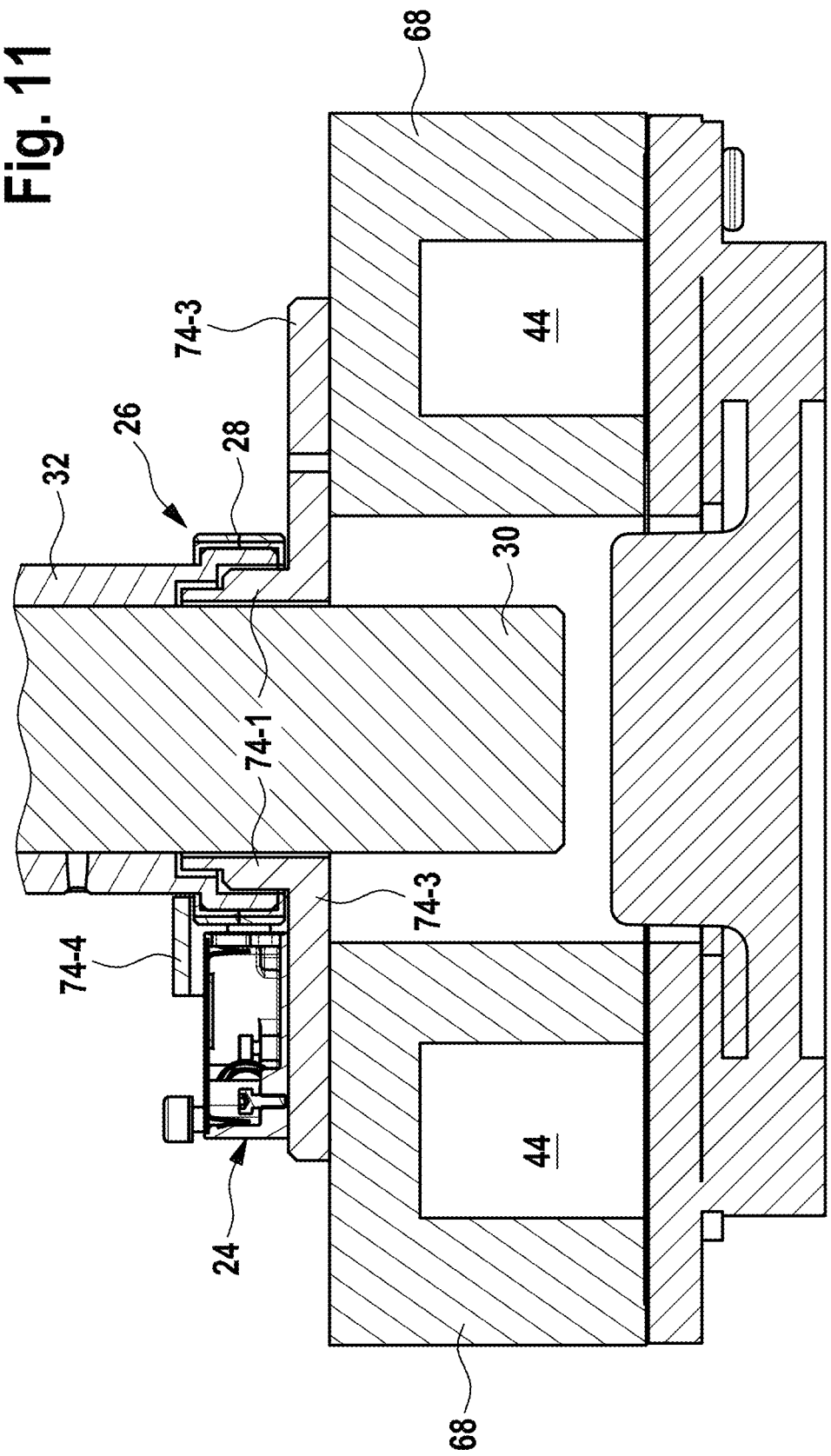

SCREENING SYSTEM FOR MAGNETIC ROTARY-ENCODER SENSOR SYSTEM

RELATED APPLICATIONS

This application is a continuation of U.S. application Ser. No. 16/320,289 filed Jan. 24, 2019, which is a national phase of International Application No. PCT/EP2018/057801 filed Mar. 27, 2018, which claims priority to German Application No. 10 2017 106 479.6 filed Mar. 27, 2017, all of which are hereby incorporated herein by reference.

TECHNICAL FIELD

The present invention relates to a (magnetically acting) screening system for a magnetic rotary-encoder sensor system in an environment of a machine such as in the environment of an electric motor having a magnetic brake including a (strong) magnetic noise or stray field generating noise signals, wherein the rotary-encoder sensor system comprises a magnetic sensor, a pole wheel, and preferably a pole-wheel carrier.

BACKGROUND

Electric machines, such as motors, cause during operating electromagnetic noise fields which can have significant influence, dependent on the performance class of the electric machine and in particular of the magnetic brake, on the functionality of electronic accessories or equipment. An exemplary electronic accessory is to be seen in a magnetically operated rotary-encoder sensor system. Magnetic rotary-encoder sensor systems typically comprise a magnetic sensor, an annular pole wheel, and preferably a sleeve-shaped pole-wheel carrier, as will be explained in more detail below. The pole wheel is either mounted directly in a rotationally-fixed manner to the machine shaft, or via a pole-wheel carrier. The magnetic sensor is arranged thereto in a distance of some few millimeters. The magnetic sensor (i.e., the sensor head) can be realized, for example, by a Hall sensor, an AMR sensor, a GMR sensor, or a TMR sensor. In general, xMR sensors are based on different effects. However, the xMR sensors have the following in common: they change their resistance dependent on external magnetic fields; they are typically realized by simple passive resistance (half) bridges which supply—almost immediately—after turning on a supply voltage, i.e. inertialess, an evaluable signal; and they can be configured high-resistive by a corresponding structuring.

Even today such magnetic sensors of rotary-encoder sensor systems are not used in the immediate environment of electric machines, since the magnetic useful field of the pole wheel is overlapped by the noise field, which makes it impossible to reasonably evaluate the magnetic useful field in terms of a signal. The useful field supplied by the pole wheel, which serves as a material measure, can be scanned by the magnetic sensor, but cannot be evaluated because it is overlapped by the noise field.

Additional accessories for the electric machines, such as spring-force brakes, prevent, additionally or alone, the use of a magnetic rotary-encoder sensor system. Spring-force brakes are actuated electromagnetically through an integrated coil and are used in areas where masses need to be decelerated or held. The braking force is generated by pressure springs so that braking torque generated by friction is also available in case when energy supply fails. In normal operation the brake causes, however, strong magnetic noise fields distorting the magnetic useful field of the rotary-encoder sensor system in a useless manner.

Since rotary-encoder sensor systems can be arranged generally, due to a very tight and limited installation space, only in the immediate vicinity of the spring-force brake, the noise field cannot be weakened due to a sufficient distance between the brake and the rotary-encoder sensor system. Therefore, magnetic sensors are not used at all with such applications by today. Hitherto, sensors, which are based on different functional principles, are used with such applications. Most times optical sensors are used. As a rule, these are more expensive and susceptible to contaminations, if not provided already in an encapsulated manner which, however, in turn increases the price. The installation space required by optical rotary-encoder systems is significantly higher than the one of magnetic rotary-encoder sensor systems.

The document DE 10 2016 002 387 A1 discloses a magnetically screened sensor arrangement. The document US 2014/0084757 A1 discloses a rotating electric machine. The document US 2014/0070649 A1 discloses a resolver including a mounting structure. The document JP 2014-87122 A discloses a rotating electric machine.

SUMMARY

Therefore, it is an object of the present invention to allow the use of a magnetic rotary-encoder sensor system in a magnetically disturbed environment. The solution should be cheap with regard to manufacturing and simple in use (e.g., mounting). The solution should be usable for different environments (different electric machines, different electric accessories, differently strong noise fields, different installation spaces, etc.).

This object is solved by a screening system for a magnetic rotary-encoder sensor system in an environment of a machine, such as in the environment of an electric motor, where a magnetic noise field is present. The rotary-encoder sensor system includes a magnetic sensor and a pole wheel, particularly being annular. The rotary-encoder sensor system can further comprise a pole-wheel carrier. The pole wheel comprises, in a circumferential direction thereof, a plurality of permanent magnets of alternating magnetic polarity (i.e., at least one north pole and one south pole) generating a useful field. The pole-wheel carrier is configured to be mounted in a rotationally-fixed manner on an axially extending rotary shaft of the machine, or the machine shaft, wherein a rotational speed and/or an angular position of the machine shaft is to be determined by means of the rotary-encoder sensor system. The magnetic sensor is positioned, in a mounted state of the rotary-encoder sensor system, distanced to the machine shaft in a rotational plane of the pole wheel, which is influenced by the noise field, and directly opposite to the pole wheel. The screening system comprises at least one deflection element, preferably being machine-fixed, which deflection element is formed and dimensioned so that a measuring volume, which is substantially free of the noise field, is established in a mounted state of the screening system. A substantially free of the noise field means that the noise field has a field strength which does not disturb a smooth operation of the rotary-encoder sensor system and which particularly allows a reliable detection and evaluation of the useful field. Within the measuring volume being free of the noise field, or directly adjacent thereto, the magnetic sensor (in particular a sensor head thereof) and such ones of the permanent magnets are positioned which are required for generating the evaluable useful field when the noise field is active.

Thus, the solution is to be seen in guiding, by means of deflection elements (e.g. bent parts, turned parts, or the like) which are preferably magnetically conductive, the magnetic noise field, which is caused by the braking coil and/or the electric motor, around a spatial region, i.e. the measuring volume, in which the magnetic sensor is to measure and has to measure the useful field of the material measure (pole wheel). Geometry and material of the deflection element are dependent on the respectively present local conditions, and thus can be different from environment to environment, or from application to application. This means that the geometries and materials are to be adapted to the respective condition.

Since magnetic fields cannot be damped or absorbed, the noise field is redirected such that the noise field does not affect the useful field to be measured. This means that at least such components of the noise field are redirected resulting in a distortion of the components of the useful field to be measured. In this context it is not required that the noise field is "displaced" out of the measuring volume at 100%. Noise-field components which are negligible small extending in parallel to the measuring direction of the rotary-encoder sensor system are tolerated. Noise-field components which are orientated, for example, perpendicular to the preferred measuring direction of the rotary-encoder sensor system, are ignorable since the useful field is not affected thereby (in a preferred measuring direction). Thus, a measuring volume "free of a noise field" can absolutely comprise noise-field components, which are even greater with regard to an amount, as long as these components are orientated sufficiently deviant (preferably perpendicular) to the preferred measuring direction of the rotary-encoder sensor system. In general, however, a sufficient change of a distribution of the noise field in the region of the circumferential surface of the pole wheel is achieved where the magnetic sensor is arranged.

Preferably, the at least one deflection element is arranged such that the at least one deflection element surrounds the measuring volume (spatially) so that components of the noise field being oriented almost parallel to a (preferred) measuring direction of the magnetic sensor are guided, by the at least one deflection element, around the measuring volume and so that a passage remains for the rotating pole wheel and the pole-wheel carrier, if a pole-wheel carrier is used.

Hence, the at least one deflection element is formed similarly to a Faraday cage, an interior of which is free of electric fields, only with the exception that magnetic fields are handled in the present case and that in the interior of the measuring volume the useful field is generated by the pole wheel.

Since the pole wheel rotates due to its rotationally-fixed connection to the machine shaft, it is necessary to provide a passage through the surrounding deflection element(s). In this case corresponding passage openings are preferably arranged and selected such that they are oriented along noise-field components which do not (or cannot) affect the useful field.

With a further preferred embodiment the first deflection element and preferably a second deflection element are provided. The first (and second) deflection element is preferably formed with a plate shape. The first and second deflection elements respectively extend parallel to the machine shaft, wherein the first deflection element is arranged radially between the machine shaft and the pole wheel, and wherein the second deflection element can be arranged radially external to the pole wheel and the magnetic sensor.

With this embodiment it is particularly assumed that the noise field (in the plane of the sensor) emerges from the machine shaft substantially perpendicular. The pole wheel sits concentrically on the machine shaft. The magnetic sensor radially sits externally to the pole wheel at a minimum distance to the pole wheel (e.g., 0.5 to 5 mm, dependent on the length of an individual pole of the pole wheel). Due to the radial positioning of the first deflection element between the machine shaft and the pole wheel the main components of the noise field are guided—at the entry side—around the measuring volume. The noise field impinges on the first deflection element almost perpendicular in this configuration.

The first deflection element represents kind of a protection wall for the part of the pole wheel, which is relevant for the useful field, and for the magnetic sensor. The second deflection element can be arranged optionally at an exit side, and is preferably oriented parallel to the first deflection element. The noise-field components redirected by the first deflection element exit from the second deflection element for being integrating again into the "normal" course of the noise field.

In particular, a third deflection element can be provided extending substantially along the rotational plane and preferably connecting the first and second deflection elements.

The third deflection element prevents that noise-field components exiting from the machine shaft axially distanced to the rotational and measuring plane stray into, or enter, the measuring volume "laterally" where no deflection elements are provided.

If the third deflection element connects the first and second deflection elements physically to each other, the to-be-redirected magnetic field lines of the noise field are guided around the measuring volume safely. Since the deflection elements are not interrupted the noise field cannot exit from the deflection elements in a desired manner either, and thus, if necessary, may still transmit undesired field components into the measuring volume.

Further, it is advantageous if the screening system further comprises the pole wheel and the pole-wheel carrier, which in particular comprises an axial sleeve portion including a radially protruding collar portion in which the permanent magnets are fixed radially, wherein the collar portion is manufactured, at least in a region close to the machine-shaft, of a magnetically non-conducting material, and wherein the first deflection element is positioned between the pole wheel, the machine shaft, and the collar portion.

Thus, the pole-wheel carrier is formed such that the first deflection element can reach behind the pole wheel. The pole wheel, the machine shaft, and the collar portion define a U-shaped cross section (section along the axis of the machine shaft) into which the first deflection element reaches. The first deflection element and the second and third deflection elements define in common a U-shaped cross section (in a plane parallel to the axis of the machine shaft). Both of the U-shaped cross sections engage each other, thereby providing an effective redirection.

If one speaks of "magnetically conducting" and "magnetically non-conducting" in the context of the present invention, this is to be understood generally such that a corresponding component is made of a material comprising a particular magnetic permeability, or magnetic conductivity "μr". The magnetic permeability determines the permeability of matter with regard to magnetic fields. Magnetic materials can be classified according to their permeability number. It is distinguished between diamagnetic materials, paramagnetic materials, and ferromagnetic materials. Diamagnetic materials, or matter, has a slightly smaller permeability than vacuum ($0 \leq \mu_r < 1$). Diamagnetic matter has the endeavor to displace the magnetic field put of its interior. The matters magnetize against the direction of an external magnetic field so that $\mu_r < 1$ is true. Paramagnetic matters comprise a permeability number which is slightly greater than 1 ($\mu_r > 1$). In paramagnetic matters the atomic magnetic moments align in external magnetic fields, and thereby amplify the magnetic field in the interior of the matter. The magnetization is also positive and therefore $\mu_r > 1$ is true. Ferromagnetic matters comprise a very large permeability number $\mu_r$ of up to 300,000. Ferromagnetic matters align its magnetic moments in parallel to the outer magnetic field, and do this in a strongly amplifying manner. Magnetic conducting matters, or materials, in terms of the invention comprise a permeability $\mu_r \gg 1$. Magnetically non-conductive matters, or materials, comprise in terms of the present invention a permeability μr of about 1.

Further, a fourth deflection element can be provided which extends in parallel, axially distanced, and radially opposite to the third deflection element, wherein the third and fourth deflection elements are preferably dimensioned as large as a base area of the magnetic sensor (sensor head and further elements, such as evaluation electronics and interfaces, etc.), and wherein the fourth deflection element is preferably connected to the second deflection element.

The third and fourth deflection elements surround the magnetic sensor in an axial direction like a sandwich, and thereby prevent noise-field lines from preventing the reasonable operation of the magnetic sensor. The third and fourth deflection elements redirect the noise-field lines around the magnetic sensor.

The optional physical connection of the fourth deflection element to the second deflection element in turn enhances the redirection of the noise field around the sensitive measuring volume.

Preferably, the at least one deflection element forms a casing of the magnetic sensor receiving the magnetic sensor and further surrounding, at least partially, the permanent magnet(s) generating the useful field.

Typically, rotary-encoder sensor systems measure the position and/or the velocity of a rotating machine shaft, or an encoder shaft. The rotary-encoder measuring system is typically positioned radially distanced in a measuring plane perpendicular to the shaft axis. Thus these constraints typically are always the same. Substantial factors, which may change, are represented by a diameter of the machine shaft as well as a strength and orientation of the noise field at the location of the rotary-encoder sensor system. The changing diameter has effects on the diameter of the pole wheel. The diameter of the pole wheel is also influenced by a resolution (number and size of the magnetic poles). Thus, dependent on the to-be-used pole wheel, a modular system can be provided where the casing of the magnetic sensor is adapted to the respectively selected pole wheel. Hence, the at least one deflection element does not need to be provided separately to the magnetic sensor but is already integrated into the magnetic sensor, i.e. into the casing thereof.

Further, it is preferred that the machine is an electric machine, in particular an electric motor, wherein the noise field is caused by an electromagnetically operated (machine) accessory, preferably by a spring-force brake. The accessory is fixed in a machine-fixed manner, and axially distanced to the rotary-encoder sensor system to a, preferably B-sided, machine shield together with the magnetic sensor, for example, within a machine-guard cover, and/or the noise field is caused by the electric machine itself, i.e. alone, wherein the machine shaft is preferably manufactured of a magnetically conducting material.

With electric machines the installation space is often very limited so that it is not possible to compensate the noise field by a corresponding distancing of the rotary-encoder sensor system. The compact type structure of the electric machines, in particular of electric motors, in particular prohibits the use of large-dimensioned rotary-encoder sensor systems such as optical rotary encoders. This in turn means that the rotary-encoder sensor system has to be positioned very close to the source of the noise field. In particular, in the environment of electric machines being driven by electromagnetic additional accessory, up to now utilization of magnetically operated rotary-encoder sensor systems is not known. The present screening system, however, now allows this.

Further, it has shown as an advantage to extend the at least one deflection element in the circumferential direction at least along the permanent magnets which are required for generating the useful field which can be evaluated by the magnetic sensor.

Thus, the at least one deflection element is dimensioned such that even components of the noise field are blocked which can enter the measuring volume laterally.

Further, it is preferred to structure the screening system radially shorter, and axially much shorter, than the machine itself.

This allows the integration of a magnetic rotary-encoder sensor system into existing electric machines, in particular into electric motors.

It is clear that the above-mentioned and hereinafter still to be explained features cannot only be used in the respectively given combination but also in other combinations or alone without departing from the scope of the present invention.

BRIEF DESCRIPTION OF THE DRAWINGS

Embodiments of the invention are illustrated in the drawings and will be explained in the following description in more detail.

FIG. 4 shows a sectional view of a machine environment including a screening system;

FIG. 10 shows a perspective view of a further alternative embodiment of the screening system; and FIG. 11 shows a sectional view of FIG. 10.

DETAILED DESCRIPTION

Figure 1A:
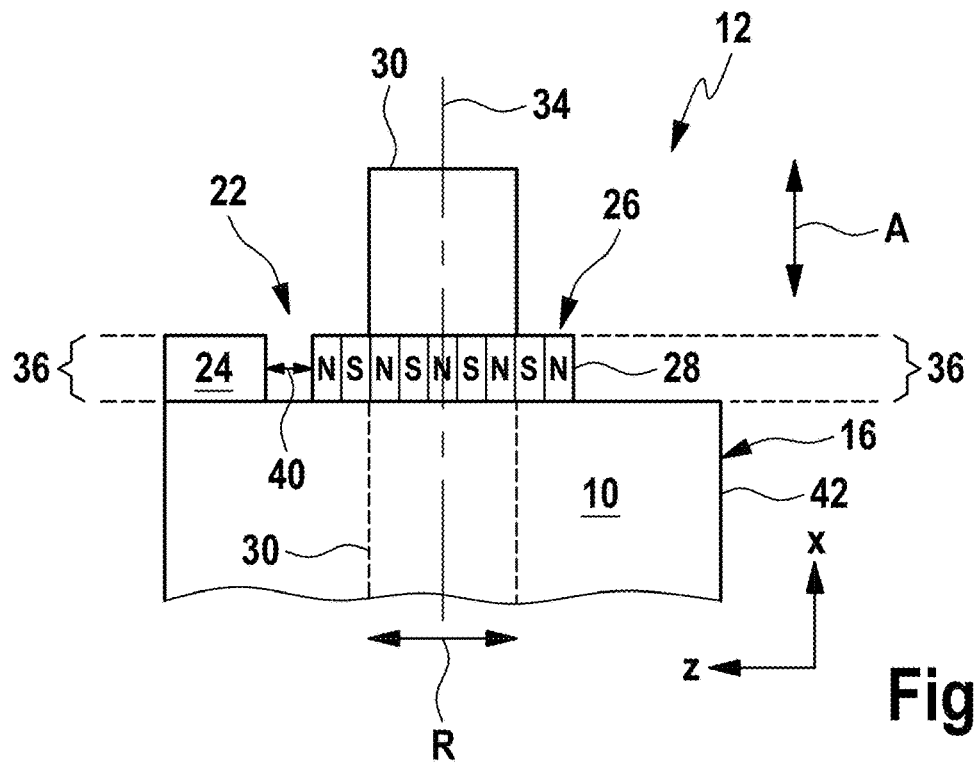
FIG. 1A shows a side view of a machine environment including a rotary-encoder sensor system without a noise field.
Figure 1B:
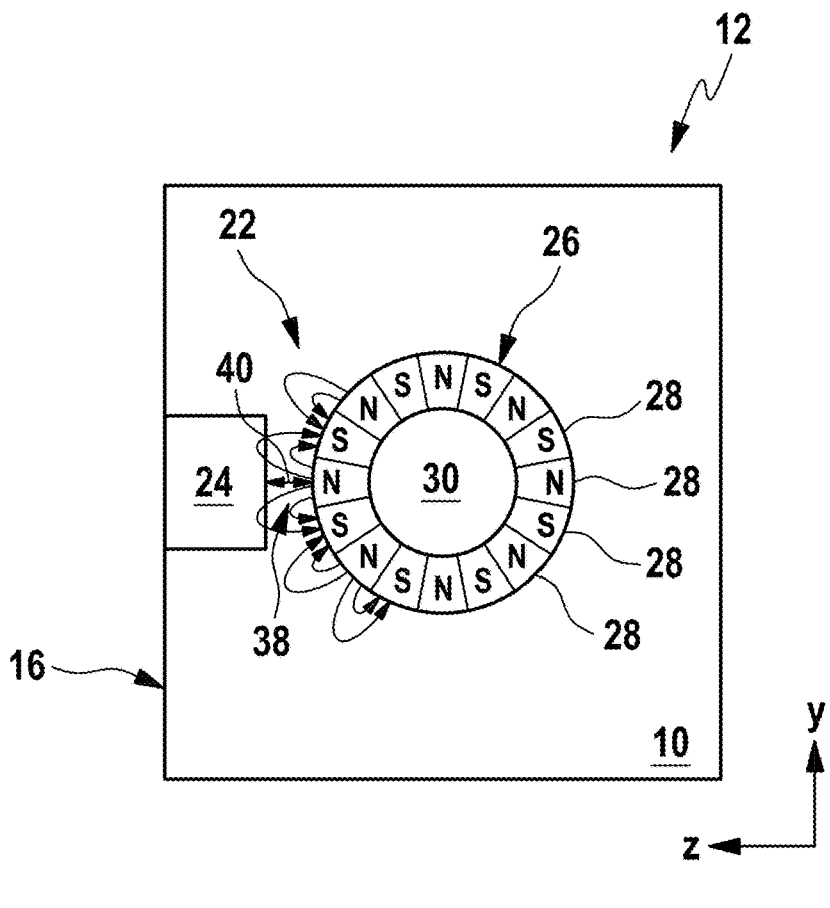
FIG. 1B shows a top view of the environment of FIG. 1A.
Figure 1C:
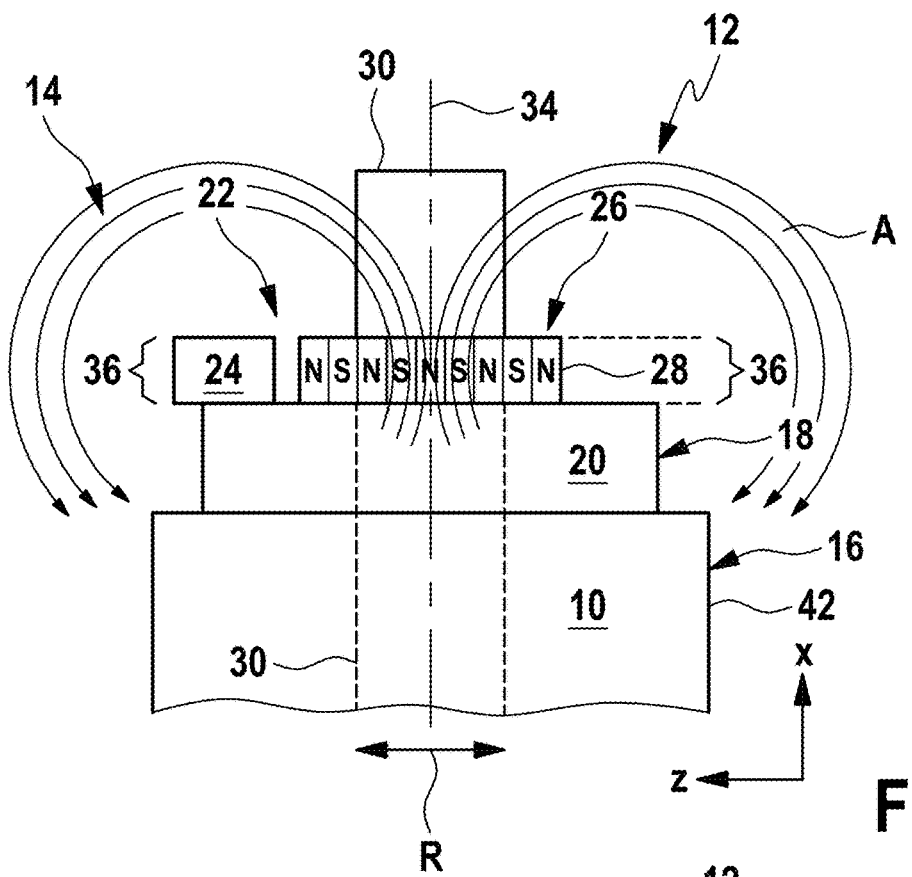
FIG. 1C shows a side view of a machine environment including a rotary-encoder sensor system and a noise field.
Figure 1D:
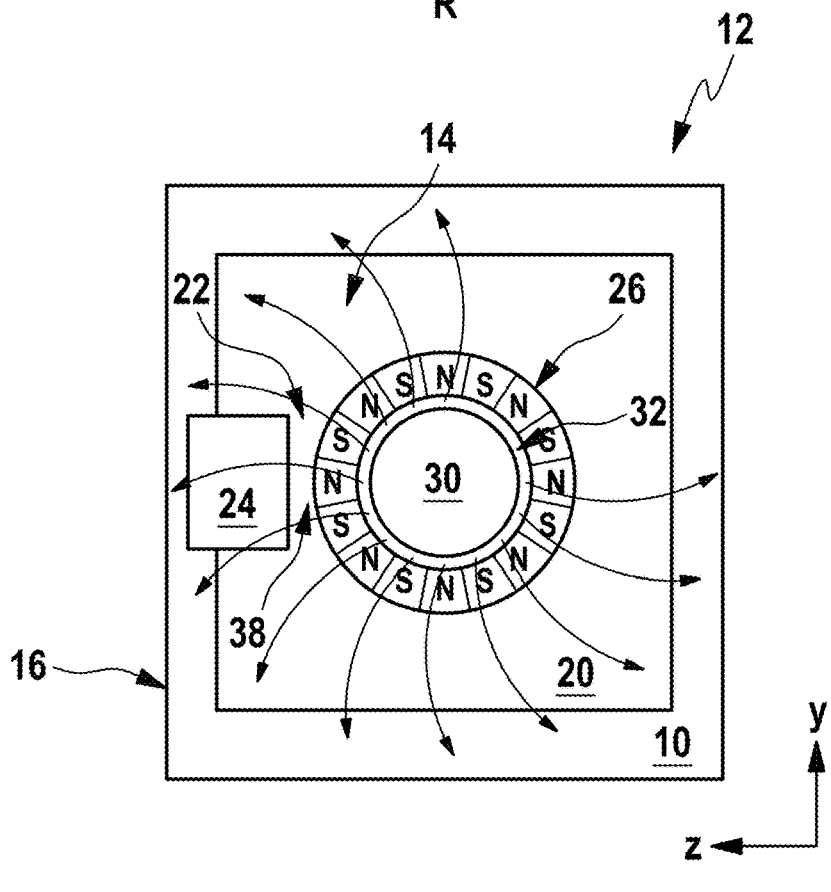
FIG. 1D shows a top view of the environment of FIG. 1C.

FIG. 1 shows a typical application with an exemplary reference to a conventional electric motor 10 (hereinafter also briefly designated "motor" 10) in an environment 12 without a magnetic noise field (FIGS. 1A and 1B) and including an acting active noise field (FIGS. 1C and 1D). The motor 10 represents an example of an electric machine 16 to which the present invention is applied. The FIGS. 1A and 1B show a side view and a top view of the motor 10 which is operated without additional accessory 18 and free of a noise field. The FIGS. 1C and 1D show a side view and a top view of the motor 10 including a (spring-force) brake 20 representing an exemplary accessory 18. The brake 20 represents an exemplary source of a noise field 14. In general, the noise field 14 can be caused by the accessory 18 and/or the machine 16.

The following description is given under simultaneous reference to each of the FIGS. 1A to 1D.

The FIGS. 1A and 1B show an operation of a magnetic rotary-encoder sensor system 22 (hereinafter also briefly designated "sensor system 22") being free of the noise field. The sensor system 22 comprises a magnetic sensor 24 and a pole wheel 26. The pole wheel 26 represents a material measure of the sensor system 22. The pole wheel 26 comprises at least two permanent magnets 28 having different magnetic polarities. In FIG. 1 a plurality of permanent magnets 28 having different magnetic polarities is shown which are arranged in a circumferential direction at an identical radius with an alternating polarity (north poles and south poles). The pole wheel 26 is arranged in a rotationally-fixed manner on a machine shaft 30 (hereinafter also briefly designated shaft 30). The pole wheel 26 can be mounted via an optionally provided pole-wheel carrier 32 (cf. FIG. 1D) in a rotationally-fixed manner on the shaft 30. The pole-wheel carrier 32 can comprise different geometries. In FIGS. 1C and 1D the pole-wheel carrier 32 is formed, for example, annularly and is configured to sit positively on the shaft 30 (in a rotationally-fixed manner). The pole-wheel carrier 32 is preferably manufactured of a magnetically non-conducting material, as will be explained in more detail below.

The shaft 30 extends axially along a shaft axis 34 (cf. FIGS. 1A and 1C). The corresponding axial direction A extending in parallel to the shaft axis 34 is indicated in FIG. 1A. A radial direction R is also indicated in FIG. 1A by means of an arrow. The radial direction R is perpendicular to the shaft axis 34 and the machine shaft 30. The directions A and R generally apply to each shown figure.

The permanent magnets 28 of the pole wheel 26 generate in a (sensor) plane 36 (cf. FIGS. 1A and 1C) a magnetic useful field 38 (cf. FIG. 1B). The plane 36 can comprise along the axial direction A different dimensions dependent on the used sensor head (Hall or xMR). The dimension in the axial direction A also depends, amongst other things, on the used type of the magnetic sensor 24. Typically, the plane 36 is perpendicular to the machine shaft 30 and thus oriented radially. The useful field 38, which is seen and evaluable by the sensor 24, is generated by such permanent magnets 28 only, which are located in the immediate spatial vicinity of the magnetic sensor 24, so that the magnetic sensor 24 can evaluate changes of the direction and/or amplitude of the useful field 38 for determining a rotational speed and/or a relative or absolute angular position of the machine shaft 30. Therefore, the magnetic sensor 24 also radially sits relatively close to the pole wheel 26. In FIGS. 1A to 1D the magnetic sensor 24 respectively is radially arranged external to the pole wheel 28. It is clear that alternatively the magnetic sensor 24 can also sit radially within the pole wheel 26—if the pole wheel 26 is correspondingly configured. In FIGS. 1A and 1B a (preferred) measuring direction 40 is indicated by a double arrow. The preferred measuring direction 40 is oriented radially due to the relative positioning of the magnetic sensor 24 and the pole wheel 26. The preferred measuring direction 40 is oriented, in the example of FIGS. 1A to 1D, parallel to the direction Z of a Cartesian coordinate system XYZ, which is the same for each of the FIGS. 1A to 1D. Typically, the preferred measuring direction 40 is oriented radially.

FIGS. 1C and 1D show the motor 10 of FIGS. 1A and 1B which has been supplemented by an accessory 18 in terms of a brake 20, in particular a spring-force brake 20. The brake 20 is arranged axially between the rotary-encoder sensor system 22 and the motor 10 on a side B of the motor 10. The side B of the motor 10, or better to say the B-support shield 42, designates a "fan side" of the machine 16. An A-support shield, which is arranged axially opposite and not shown here, typically designates a drive side. Thus, the environment 12 distinguishes in particular in that a "side B" of the machine 16 is considered, which is always structured extremely compact from the point of view of the manufacturer of the machine.

The brake 20 is operated electromagnetically by applying current to an integrated coil 44, which is not shown in the FIGS. 1C and 1D. Because of the application of current the brake 20 generates a noise field 14, as indicated in FIGS. 1C and 1D by corresponding field-line arrows. Since the coil 44 is located in a radial plane, the field lines of the noise field 14 in the region of the machine shaft 30 run substantially in parallel relative to the machine shaft 30 and the shaft axis 34. If the machine shaft 30 is manufactured of a magnetically conducting material the parallel alignment is amplified within the shaft 30. The field lines exit the shaft 30 at an axial height of the plane 36, however, substantially perpendicular to the shaft axis 34, as will be explained and shown in more detail below. Thus, the noise field 14 in the axial region of the plane 36 "scatters or strays" substantially parallel to the preferred measuring direction 40 into the plane 36. The noise field 14 superimposes the useful field 38 in the measuring region of the magnetic sensor 24 and the pole wheel 26 due to its almost parallel alignment in an amplifying—or weakening—manner. This results in that the magnetic sensor 24 does not provide a signal which can be evaluated.

Figure 2A:
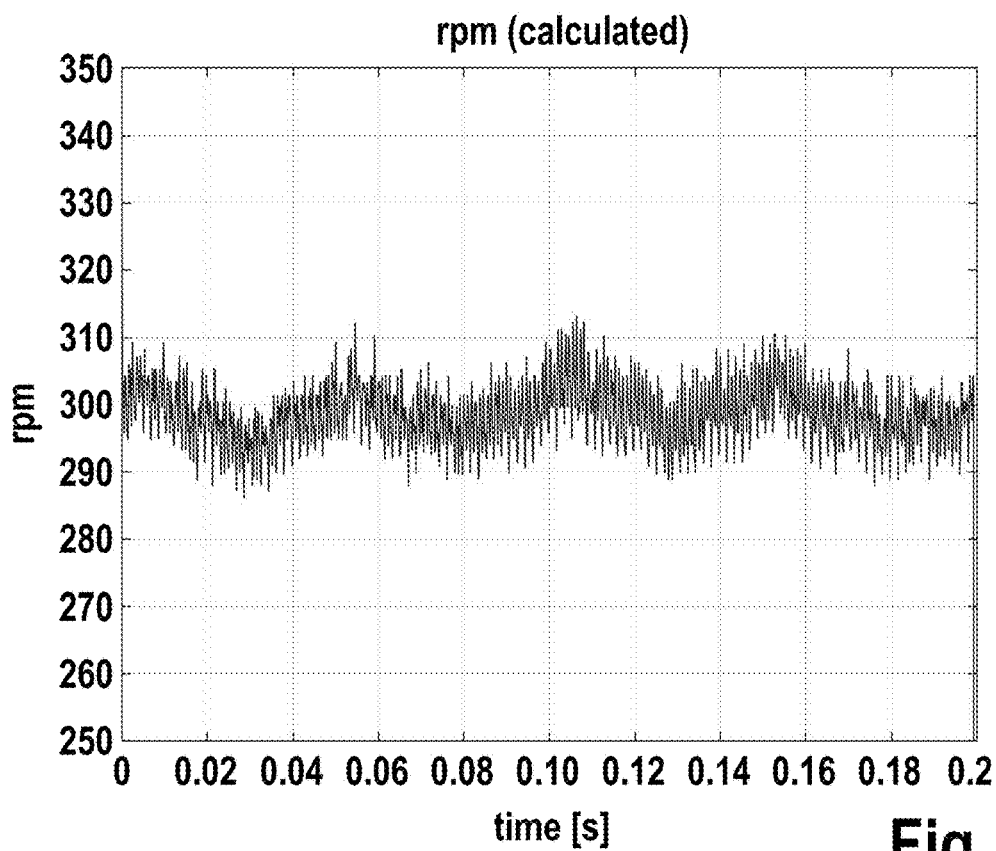
FIG. 2A shows a graph indicating a calculated revolution rate for the environment of the FIGS. 1A and 1B.
Figure 2B:
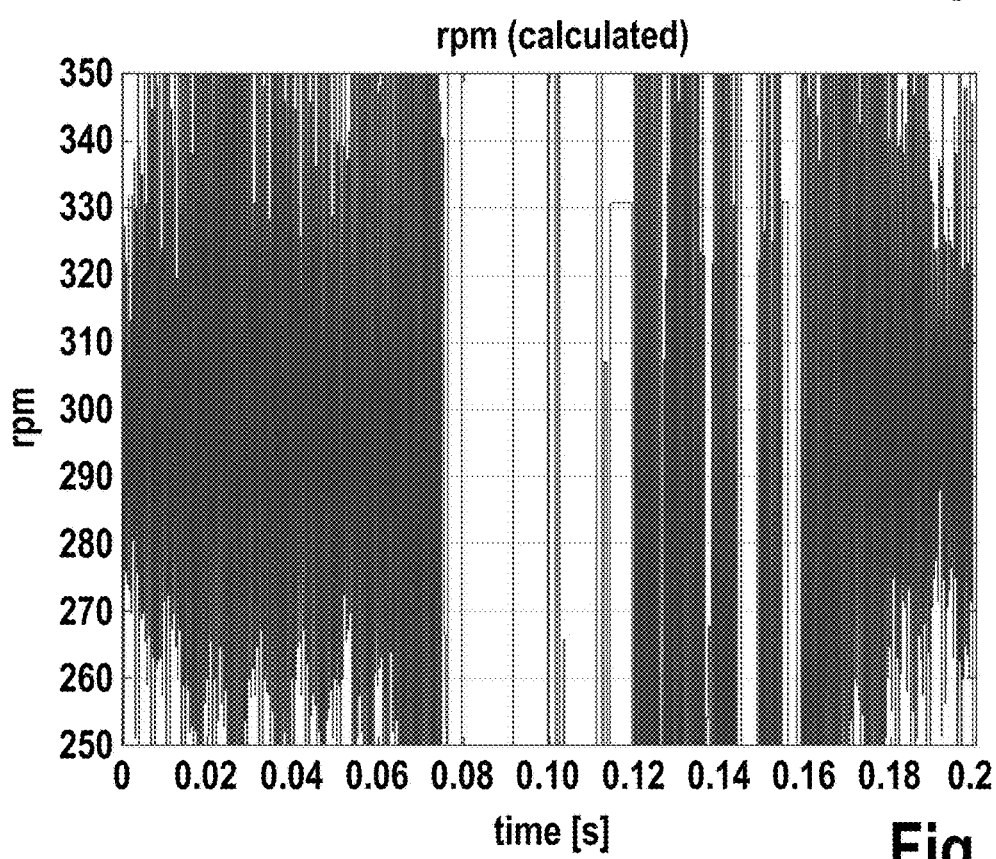
FIG. 2B shows a graph indicating a calculated revolution rate for the environment of the FIGS. 1C and 1D.

The FIGS. 2A and 2B show calculated rotational speeds of the machine shaft 30 at a set rotational speed of 300 revolutions per minute and a recording period of 200 milliseconds, which corresponds in this case exactly to one revolution. FIG. 2A shows the calculated rotational speed when the brake 20 is turned off. FIG. 2B shows the calculated rotational speed when the brake 20 is turned on.

Figure 3:
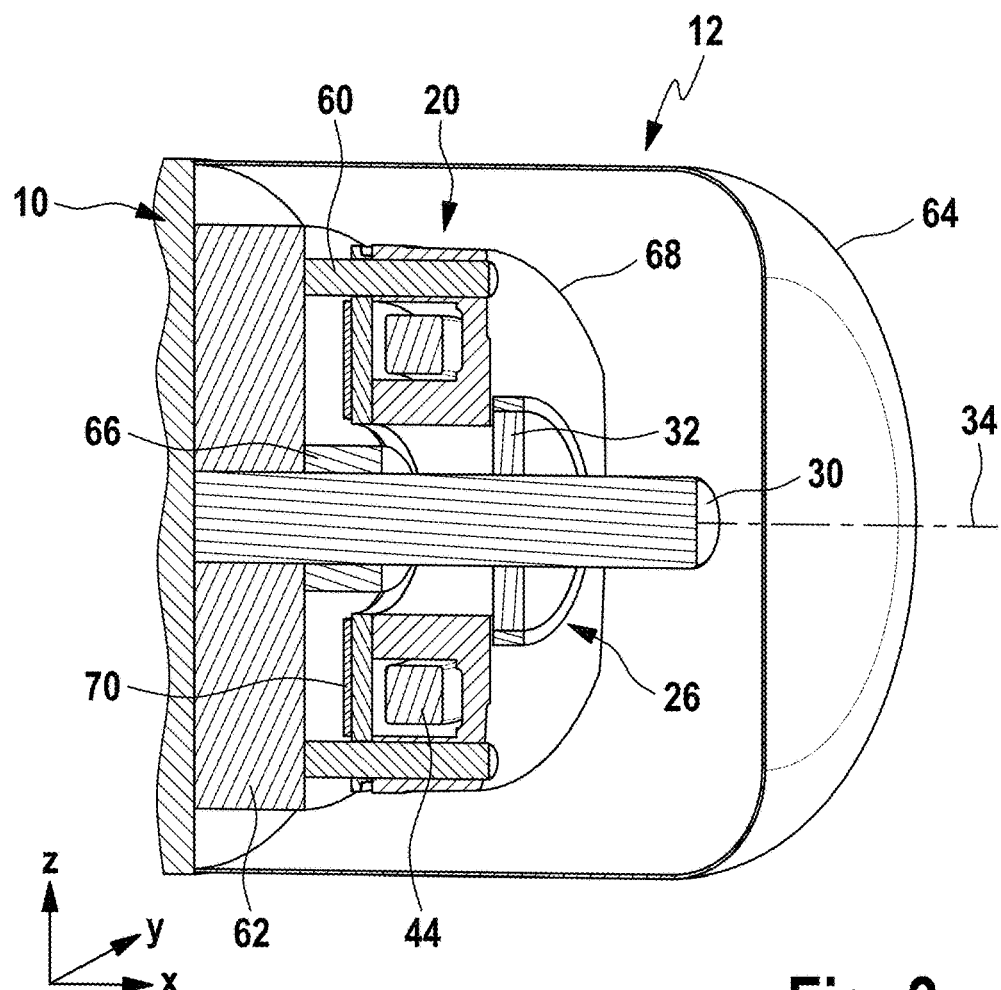
FIG. 3 shows a perspective sectional view of an environment similar to the FIGS. 1B and 1D without a screening system.

FIG. 3 shows a perspective view of a (machine) environment 12 including an exemplary electric motor 10, an exemplary spring-force brake 20, a pole wheel 26, and an optional pole-wheel carrier 32, similar to the environment 12 of the FIGS. 1C and 1D. The spring-force brake 20 can be fixed via one or more distance pins 60 in an axially distanced manner to a B-sided machine shield 62 in a machine-fixed manner. A machine-fixed fixation is to be understood as a fixation where the corresponding element does not rotate with the machine shaft 30 but is connected stationary (statically) to the machine 16. Further, an (optional) guard cover 64 is shown enclosing the machine shield 62, the spring-force brake 20, and the rotary-encoder sensor system 22, and preferably enclosing the same in a sealing manner, wherein the pole wheel 26 and the pole-wheel carrier 32 of the rotary-encoder sensor system 22 are shown only. A gear 66, which serves as a follower for a, not shown and not designated in more detail, brake lining of the brake 20, sits on the machine shaft 30. The pole wheel 26 is connected rotationally-fixed to the machine shaft 30 via the pole-wheel carrier 32. In FIG. 3 also the coil 44 of the brake 20 is illustrated. The coil 44 is arranged annularly and coaxially to the shaft axis 34 within a brake casing 68. The brake casing 68, which is preferably manufactured of a magnetically conducting material, is covered by an anchor plate 70 on a side facing the machine shield.

The example of FIG. 3 easily shows that an available installation space, which is substantially limited by the guard cover 64, is very small for receiving the magnetic sensor, which is not illustrated here.

FIG. 4 shows a sectional view, being almost identical to FIG. 3, wherein the pole-wheel carrier 32 is slightly turned away, and wherein a screening system 72 is additionally shown. The screening system 72 comprises one or more deflection elements 74. The deflection elements 74 can be implemented by reshaped parts, turned parts, or the like made of a magnetically conducting material (e.g., steel of the type ST34 having a $\mu_r$ of 6,000-8,000).

The sectional illustration of FIG. 4 shows a first deflection element 74-1 extending substantially axially, i.e. parallel to the machine shaft 30, and being arranged radially between the pole wheel and the machine shaft 30. Further, a third deflection element 74-3 and a fourth deflection element 74-4 are shown. The third and fourth deflection elements 74-3 and 74-4 extend substantially radially outward. The second deflection element 74-2, which extends parallel to the first deflection element 74-1 at a location being radially further outside to the pole wheel 26, is not shown in the sectional illustration of FIG. 4. The third deflection element 74-3 connects the first deflection element 74-1 physically to the second deflection element 74-2, as will be explained in more detail below. The third and fourth deflection element 74-3 and 74-4 extend parallel to each other. The third and fourth deflection element 74-3 and 74-4 preferably extend along the axial outer limits of the plane 36 (cf. FIGS. 1A and 1C).

In general, one single deflection element 74 may be sufficient for causing the screening effects described below. In FIG. 4 the deflection element 74-1 may already be sufficient.

Usually the deflection elements 74 are arranged in a machine-fixed manner. However, there are embodiments where at least some of the deflection elements are fixed in a rotationally-fixed manner to the machine shaft 30. This is not shown in FIG. 4. In FIG. 4 the third deflection element 74-3 is connected in a machine-fixed manner to the brake casing 78.

The magnetic sensor 24, or the position thereof, is indicated in FIG. 4 by means of a dashed line. The magnetic sensor 24 is arranged axially between the third and fourth deflection elements 74-3 and 74-4. Both the magnetic sensor 24 and the pole wheel 26 are arranged within a measuring volume 76, which is almost free of the noise field, indicated in FIG. 4 by a dashed line as well. The measuring volume 76 is free of the noise field because the magnetically conducting deflection elements 74 cause the noise field 14 to not enter the measuring volume 76. The measuring volume 76 spreads within the space between the magnetic sensor 24 and the permanent magnets 28, which are responsible for the generation of the (evaluable) useful field 38. In its smallest embodiment the measuring volume 76 is just as large that the space between the magnetic sensor 24 and the corresponding permanent magnets 28 is free of the noise field. This means that the magnetic sensor 26 and the permanent magnets 28, from the outside, are directly adjacent to this smallest space. It is clear that the measuring volume 76 can also be formed bigger so that the measuring volume 76 even surrounds the magnetic sensor 24 and/or the relevant permanent magnets 28, at least partially.

With the embodiment of FIG. 4 the noise-field-free measuring volume 76 actually reaches even further radially to the outside than shown, because the third and fourth deflection elements 74-3 and 74-4 extend radially far to the outward so that even further components (e.g., evaluation electronics, interfaces, etc.) of the magnetic sensor 24 may be received spatially.

Figure 5:
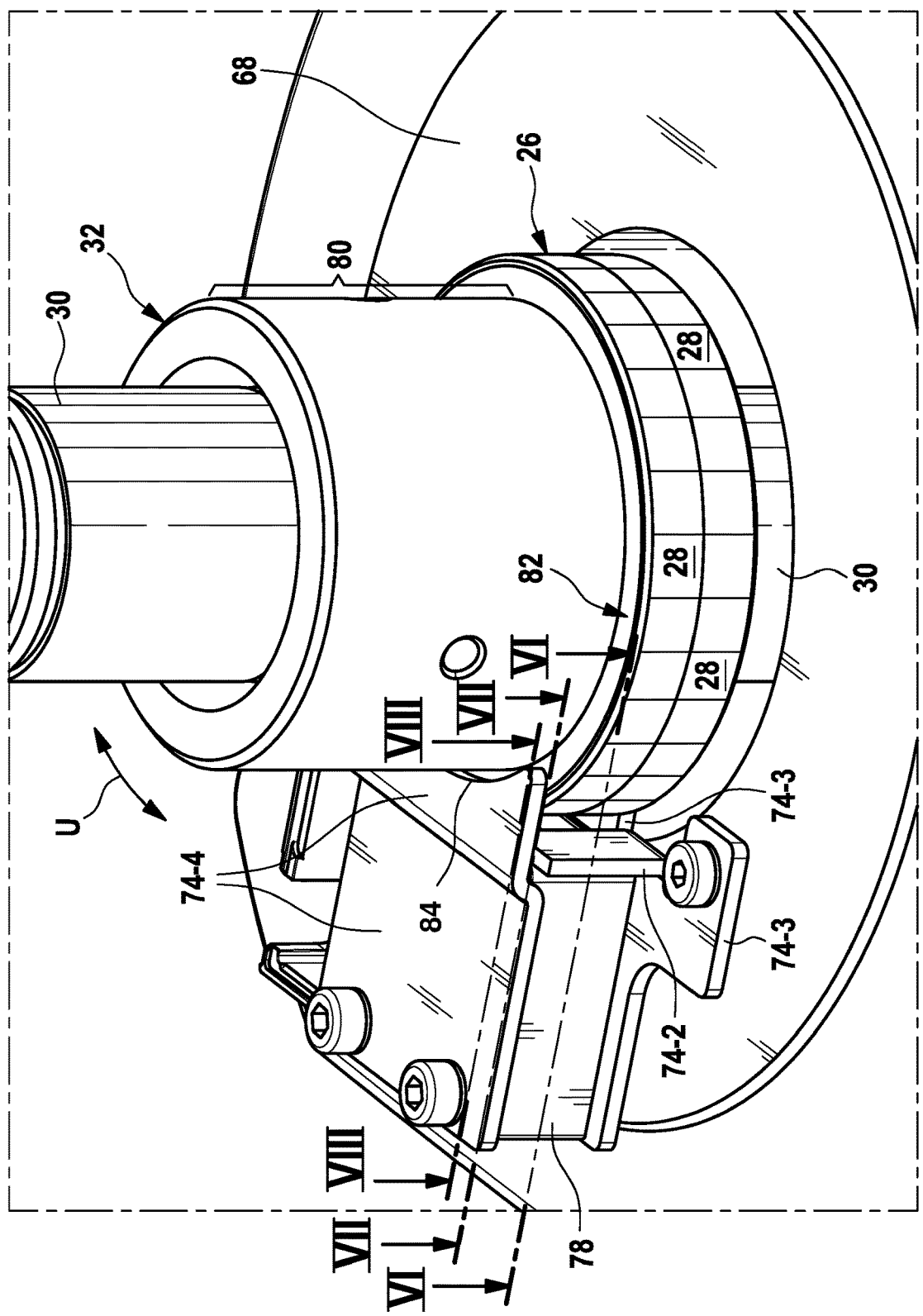
FIG. 5 shows a perspective view of the screening system of FIG. 4.

FIG. 5 shows a perspective view of the environment 12 of FIG. 4. The third and fourth deflection element 74-3 and 74-4 are clearly recognizable, which surround a sensor casing 78 like a sandwich. Further, a first part of the second axially oriented deflection elements 74-2 is illustrated here. The pole-wheel carrier 32 comprises an axial sleeve portion 80 and a radially protruding collar section 82. The fourth deflection element 74-4 comprises in the region of the second deflection element 74-2, for example, a slight axial step. In the region of the pole carrier 32 an edge 84 of the fourth deflection element 74-4, which faces the machine shaft 30, is formed positively (and distanced) to the radially adjacent pole carrier 32. In the circumferential direction U a length of the fourth deflection element 74-4 is selected such that the permanent magnets 28, which generate the evaluable useful field 38 (compare FIG. 1A) are screened against the noise field 14 (compare FIGS. 1C and 1D).

In particular, this results from the arrows shown in FIG. 4 which indicate the magnetic field lines caused by the noise field 14. The noise field is not shown completely. Only relevant parts are shown. Within the shaft 30 the field lines are oriented axially. The field lines exit the surface of the machine shaft 30 almost perpendicular. Axially beneath the rotary-encoder sensor system 22 the field lines enter the brake casing 68 perpendicularly, which is manufactured in FIG. 4 of a magnetically conducting material. By the way, the machine shaft 30 in the example of the figure is also manufactured of a magnetically conducting material. In the axial region of the sensor plane 36 the field lines enter radially the axially oriented first deflection element 74-1, and are redirected within the first deflection element 74-1 along the first deflection element 74-1 into the third deflection element 74-3 for exiting the same again at a radial outer end thereof. Since the pole-wheel carrier 32 is manufactured of a magnetically non-conducting material, which has a permeability $\mu_r$ of about 1 (air), the magnetic field lines pass the pole carrier 32 almost undisturbed. Axially between the first deflection element 74-1 and the fourth deflection element 74-4 the magnetic field lines, which are coming in from the machine shaft 30, are redirected into the corresponding deflection elements 74-1 and 74-4. The magnetic field lines, which enter the fourth deflection element 74-4, follow the fourth deflection element 74-4 up to an outer radial end thereof. There the field lines exit again and orientate according to the actual course of the magnetic field lines of the noise field 14.

The magnetic field lines, which are generated by the pole wheel 26 itself, i.e. the useful field 38, are not illustrated in FIG. 4. However, the illustration of FIG. 4 shows that almost any field line of the noise field 14 is in an interior (including the measuring volume) formed by the deflection elements 74. In particular, in some cases some negligible small field components of the noise field 14 are still present in the measuring volume 76. If the magnetic sensor 24 and the pole wheel 26 are placed in this region an undisturbed operation is possible in spite of a significant field 14 which can be greater than the useful field 38 by a factor of 300.

Figure 6:
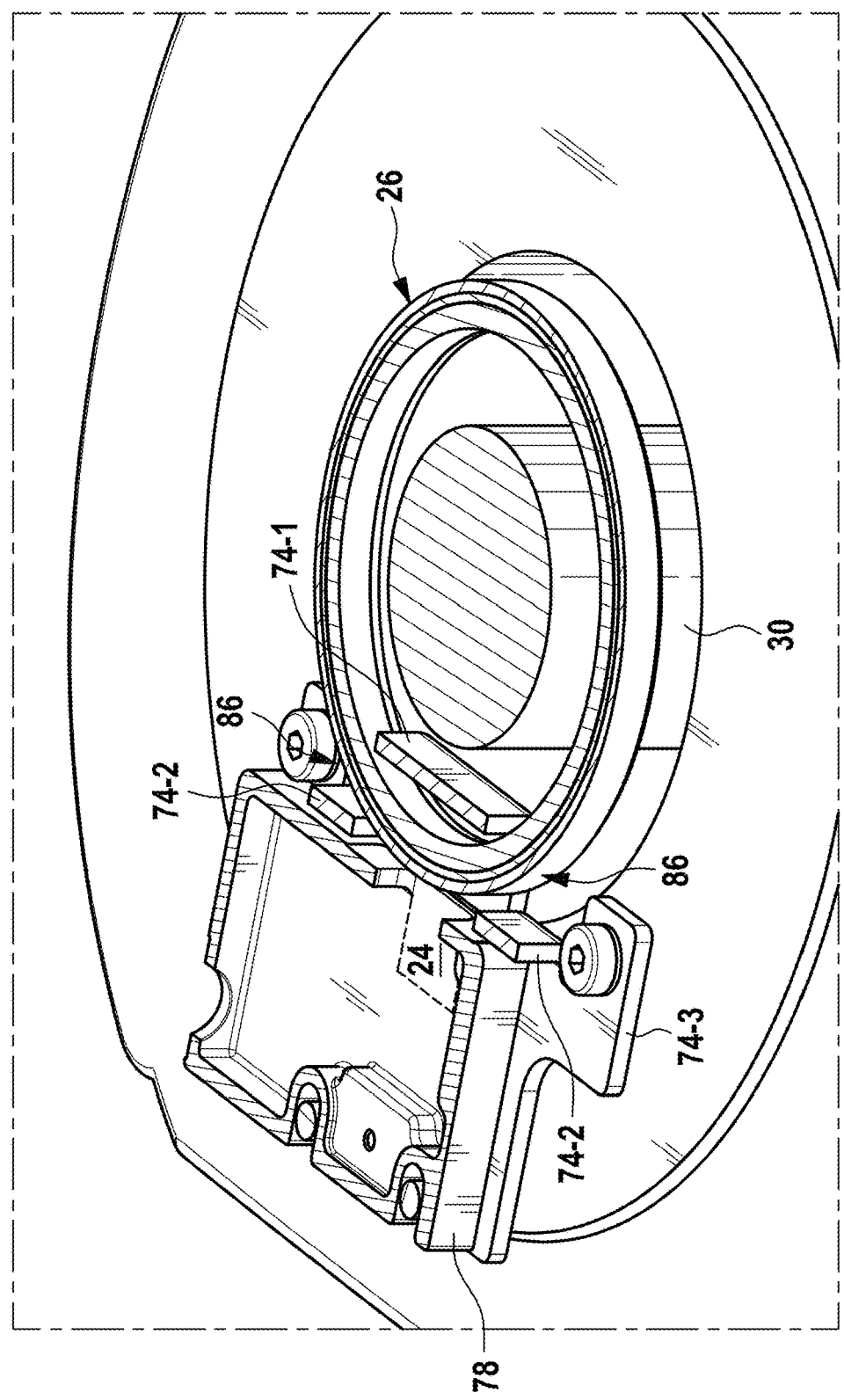
FIG. 6 shows a section along a line VI-VI of FIG. 5.

FIG. 6 shows the first deflection element 74-1 of FIG. 4 once again in more detail. FIG. 6 represents a sectional view perpendicular to the machine shaft 30 along a line VI-VI in FIG. 5. One recognizes that the axial first deflection element 74-1 is arranged radially between the pole wheel 26 and the machine shaft 30. The axial second deflection element 74-2 is formed by two parts. The second deflection element 74-2 also extends in the axial direction and in particular parallel to the first deflection element 74-1. Both length of the first deflection element 74-1 and length of the two second deflection elements 74-2 are selected such that as many permanent magnets 28 of the pole wheel 26 as possible are surrounded in a screened manner. The length of the first deflection element 74-1 is substantially limited by the diameter of the pole wheel 26. The first and the second deflection elements 74-1 and 74-2 are dimensioned and formed such that a channel-shaped passage 86 for the pole wheel is defined therebetween. The passage 86 represents a space through which the pole wheel 36 moves during operation.

Figure 7:
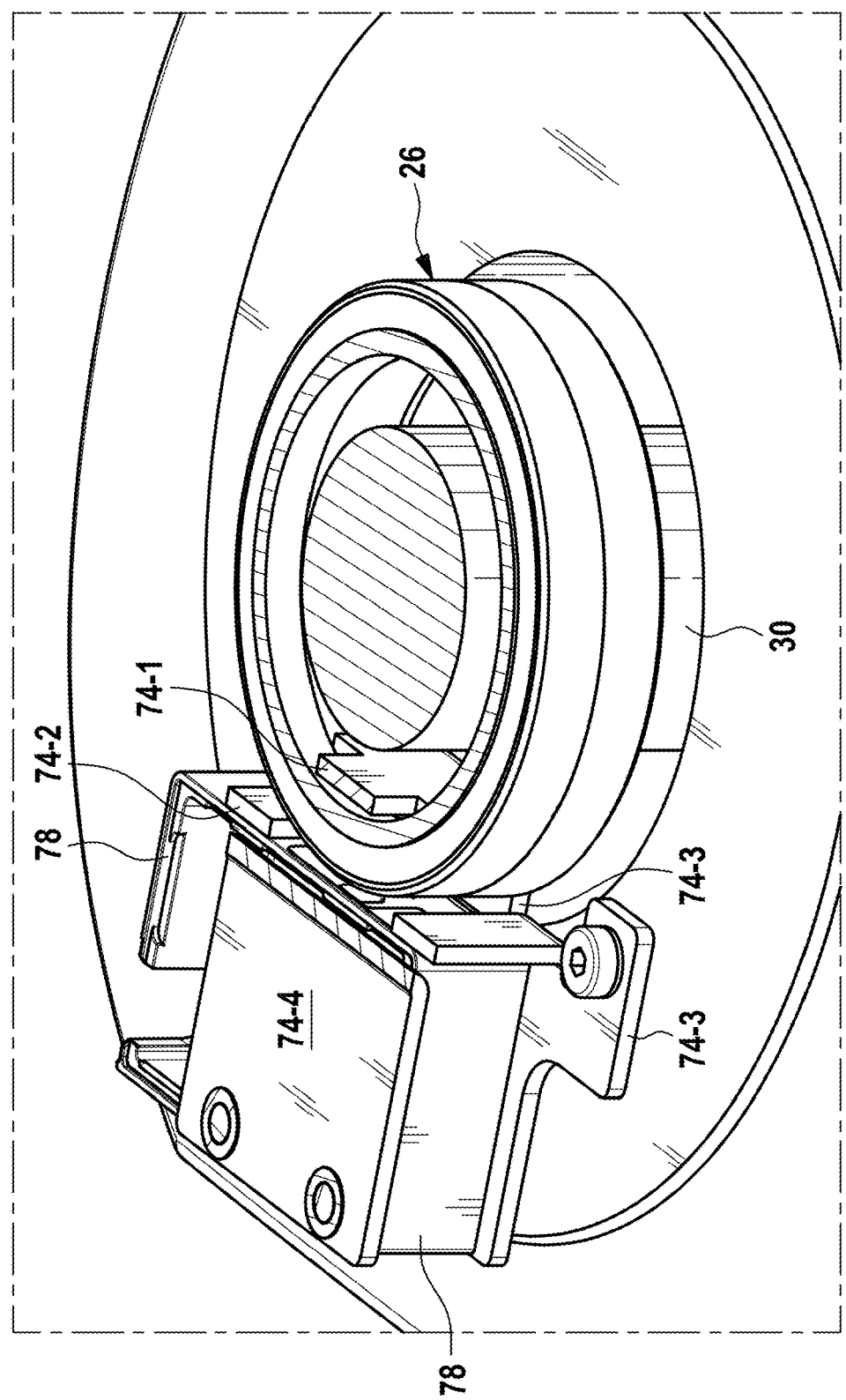
FIG. 7 shows a sectional view along the line VII-VII of FIG. 5.

FIG. 7 shows a further sectional view similar to FIG. 6, however, along a line VII-VII in FIG. 5. The section VII-VII extends narrowly above the upper surface of the fourth deflection element 74-4. The second deflection elements 74-2 are illustrated completely now.
The first deflection element 74-1 is tapered once again in the axial direction for adapting to a contour of the pole wheel 26 as optimal as possible. The first to third deflection elements 74-1 to 74-3 are preferably formed integrally (for example by seaming).

Figure 8:
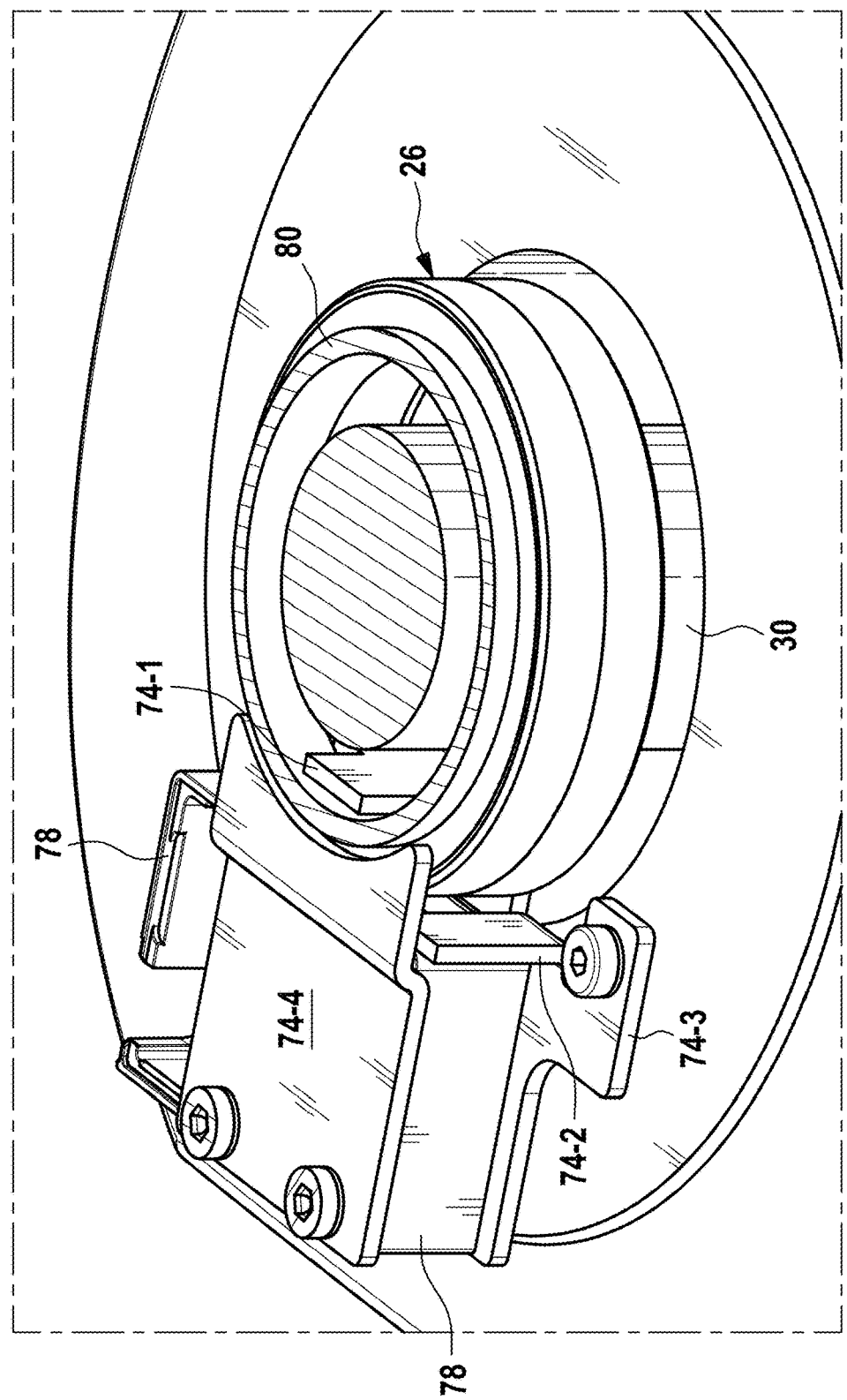
FIG. 8 shows a sectional view along the line VIII-VIII of FIG. 5.

FIG. 8 shows a sectional view along a line VIII-VIII in FIG. 5, similar to the sectional views of FIGS. 6 and 7, for the purpose of explaining the positive adaption of the fourth deflection elements 74-4 to the contour of the sleeve portion 80 of the pole-wheel carrier 32.

It is clear that the sensor casing 78 can be formed optionally as one piece, or integrally, together with the deflection elements 74. Further, it is clear that the fourth deflection element 74-4 can be connected physically also to the second deflection elements 74-2.

Additionally, the first deflection element 74-1 and/or the third deflection element 74-3 may extend fully, i.e. 360°, around the shaft 30 circumferentially. In this case, the first deflection element 74-1 and/or the third deflection element 74-3 may be formed as a (circular) disk.

Figure 9:
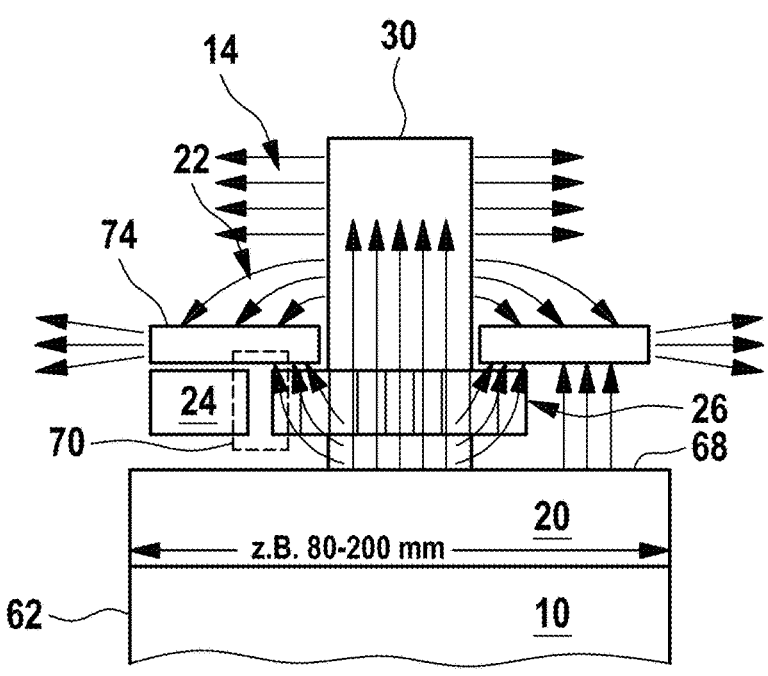
FIG. 9 shows a sectional view of an alternative screening system having only one single screening element.

FIG. 9 shows a schematic illustration of a modification of the screening system 72 requiring only one single deflection element 74. The deflection element 74 is formed like a disk and oriented radially. The disk-shaped deflection element 74 comprises a passage opening for passing the machine shaft 30. The deflection element 74 encloses the magnetic sensor 24, which is preferably arranged relatively far to the outside in the radial direction, in the axial direction between itself and the brake casing 68 of the brake 20, which in turn is mounted to a machine shield 62 of an exemplary motor 10. The pole wheel 26 is mounted in a rotationally-fixed manner directly (i.e., without a pole-wheel carrier 32) on the machine shaft 30 in the present example. The pole wheel 26 is arranged in the axial direction between the disk-shaped deflection element 74 and the brake 20. The pole wheel 26 is arranged radially immediate opposite to the magnetic sensor 24.

FIG. 9 serves for explaining that even already one single deflection element 74 can be sufficient for deflecting such components of the noise field 14 which could negatively affect a measurement of the magnetic sensor 24. The measuring volume 76 is not completely free of field lines of the noise field 14. Within the measuring volume 76 axially oriented components of the noise field 14 are present. However, these axially oriented components do not disturb a measurement of the magnetic sensor 24 in the radial direction since they are oriented perpendicularly to the preferred measuring direction 40 of the magnetic sensor 24, which is not shown in more detail here.

For explaining the very small installation spaces a diameter region for the brake 20 of exemplary 80 to 200 mm is indicated.

The FIGS. 10 and 11 show a further embodiment of the screening system 72. FIG. 10 shows a perspective view of the screening system 72. FIG. 11 shows a sectional view along the axial direction centrally through the screening system 72 of FIG. 10.

The screening system 72 of FIGS. 10 and 11 in turn comprises the axial first deflection element 74-1, exemplarily two axial second deflection elements 74-2, the third disk-shaped radial deflection element 74-3, as well as the plate-shaped radial fourth deflection element 74-4. The screening system 72 of FIGS. 10 and 11 distinguishes from the previous screening systems 72 substantially in that the third deflection element 74-3 is formed like a disk (preferably as a turned part). The corresponding disk preferably extends over 360° and radially almost as far as the brake 20 and the motor 10. Of course, numbers of degrees different to 360° can also be selected. The radial third deflection element 74-3 is preferably formed integrally together with the axial first deflection element 74-1. A contour of the first deflection element 74-1 is preferably adapted to a contour of the pole-wheel carrier 32 such that a less as possible air is present between the first deflection element 74-1 and the pole-wheel carrier 32.

The second deflection elements 74-2 and the fourth deflection element 74-4 are formed as brackets and serve for fixing and positioning the magnetic sensor 24 relative to the pole wheel 26 and the machine shaft 30, respectively. Here this bracket surrounds a part of the magnetic sensor 24 arranged radially at an inside. Contrary to the previous embodiments of the screening system 72 the two second deflection elements 74-2 are positioned, however, at the outside, as shown in FIG. 10. This means that, between the two second deflection elements 74-2 shown in FIG. 10, any further second deflection elements 74-2 are arranged. The two second deflection elements 74-2 shown in FIG. 10 represent the legs of the U-shaped bracket by which the magnetic sensor 24 is fixed and positioned. The fourth deflection element 74-4 is formed like a plate, and connects the two second deflection elements 74-2 to each other, preferably integrally. A contour of the fourth deflection element 74-4 is not adapted to the pole-wheel carrier 32 in the present case. The fourth deflection element 74-4 also preferably represents a straight strip. However, this is sufficient since the substantial components of the noise field are blocked and redirected, respectively, by the axial first deflection element 74-1.

The pole-wheel carrier 32 in turn is formed magnetically non-conducting with the embodiment according of FIGS. 10 and 11. For example, the pole-wheel carrier 32 can be manufactured of stainless steel of the type 1.4301 having a permeability of $\mu_r \leq 2$. Alternatively, the pole-wheel carrier 32 can be made, for example, of aluminum. The deflection elements 74 in turn are magnetically conductive and can be manufactured, for example, of ST37 (S235JR) having a permeability of about 6,000 to 8,000.

A big advantage, which can be seen in the specific embodiment of FIGS. 10 and 11, is to be seen in that in particular the first and third deflection elements 74-1 and 74-3 can be manufactured as one single turned part. Further, the disk-shaped body of the third deflection element 74-3 covers the casing 68 of the brake 20 by a large-area so that substantially the machine shaft 30 is to be seen as the source of the noise field.

LIST OF REFERENCE NUMERALS

10 Electric motor/motor
12 Environment
14 Magnetic noise field
16 Machine, preferably electrical
18 Accessory
20 (Spring force) brake
22 Rotary-encoder sensor system, magnetic
24 Magnetic sensor
26 Pole wheel
28 Permanent magnet
30 (Machine) shaft
34 Pole-wheel carrier
Shaft axis
A Axial direction
R Radial direction
36 (Sensor) plane
38 Useful field, magnetic
40 (Preference) measuring direction of 24
42 Machine shield (B) of 16
44 Coil of 20
60 Distance pin
62 Machine shield
64 Guard cover
66 Gear
68 Brake casing
70 Anchor plate
72 Screening system
74 Deflection element
76 Measuring volume, free of noise field
78 Casing of 24
80 Sleeve portion of 32, axial
82 Collar portion of 32, radially protruding
84 Edge of 74-4
86 Passage

What is claimed is:

1. An apparatus comprising: a rotating machine shaft a rotary-encoder sensor system, and a screening system for the magnetic rotary-encoder sensor system in an environment having an ambient magnetic noise field, wherein the rotary-encoder sensor system comprises a magnetic sensor, a pole wheel, and a pole-wheel carrier, wherein the pole wheel comprises in a circumferential direction a plurality of permanent magnets of alternating magnetic polarity generating a measurable magnetic field, wherein the pole-wheel carrier is configured to be mounted to the rotating machine shaft that rotates the pole-wheel carrier, the rotating machine shaft extending axially, wherein the magnetic sensor is mounted relative to the machine shaft, in a rotational plane of the plurality of permanent magnets, and radially directly opposite to the plurality of permanent magnets, wherein the screening system comprises:

first and second magnetically conducting deflection elements being formed and dimensioned such that a measuring volume is established adjacent to the magnetic sensor and/or at least partially around the magnetic sensor, which the measuring volume has a magnetic noise field less than the ambient magnetic noise field;

wherein the first magnetically conducting deflection element longitudinally extends parallel to the machine shaft, and is arranged radially between the machine shaft and the plurality of permanent magnets;

wherein the second magnetically conducting deflection element extends radially outwardly from the first magnetically conducting deflection element; and wherein the first and second magnetically conducting deflection elements are stationary and fixed in position relative to the plurality of permanent magnets and relative to the magnetic sensor.

2. The apparatus of claim 1, wherein the first and second magnetically conducting deflection elements are arranged at least partially around the measuring volume such that components of the noise field that are parallel to a measuring direction of the magnetic sensor are guided by the first and second magnetically conducting deflection elements in a direction around the measuring volume, and such that a gap is formed between the pole wheel and the rotating machine shaft within which the first magnetically conducting deflection element is disposed in spaced apart relation to the pole wheel and to the rotating machine shaft.

3. The apparatus of claim 1, further comprising a third magnetically conducting deflection element that longitudinally extends parallel to the machine shaft and is radially outwardly spaced from the first magnetically conducting deflection element, and wherein the third magnetically conducting deflection element is arranged radially external to the plurality of permanent magnets and the magnetic sensor.

4. The apparatus of claim 1, wherein the second magnetically conducting deflection element is connected to a bottom portion of the first magnetically conducting deflection element, and the second magnetically conducting deflection element extends along the rotational plane from the bottom portion of the first magnetically conducting deflection element to a region below the magnetic sensor.

5. The apparatus of claim 4 further comprising the pole wheel and the pole-wheel carrier, which comprises an axial sleeve portion including a radially protruding collar portion, to which the plurality of permanent magnets are fixed radially, wherein the pole-wheel carrier includes a material which is magnetically non-conducting, and wherein the first magnetically conducting deflection element is positioned radially inwardly spaced apart relative to the pole wheel and the collar portion, and radially outwardly spaced apart relative to the machine shaft.

6. The apparatus of 3, further comprising a fourth magnetically conducting deflection element that extends parallel to the second magnetically conducting deflection element, and wherein the fourth magnetically conducting deflection element is axially spaced apart from second magnetically conducting deflection element.

7. The apparatus of claim 6, wherein the first, second, third and fourth magnetically conducting deflection elements cooperate to form a casing that contains the magnetic sensor.

8. The apparatus of claim 1, wherein the magnetic sensor is at least one of a Hall sensor or an xMR sensor.

9. The apparatus of claim 6, wherein the fourth magnetically conducting deflection element includes an edge that faces the machine shaft and extends in the circumferential direction.

10. The apparatus of claim 3, wherein the second magnetically conducting deflection element connects the first and third magnetically conducting deflection elements.

11. The apparatus of claim 6, wherein the second and fourth magnetically conducting deflection elements are dimensioned at least as large as a base area of the magnetic sensor, and wherein the fourth magnetically conducting deflection element is connected to the third magnetically conducting deflection element.

12. The apparatus of claim 1, wherein the machine shaft is manufactured of a magnetically conducting material.

13. A method of assembling a screening system in a magnetic rotary-encoder sensor system mounted to a rotating machine shaft of a machine in which an environment of the machine includes an ambient magnetic noise field, in which the rotary-encoder sensor system has a magnetic sensor and a pole wheel having, in a circumferential direction, a plurality of permanent magnets of alternating magnetic polarity generating a measurable magnetic field, and in which the magnetic sensor is positioned in a rotational plane of the plurality of permanent magnets, and radially directly opposite to the plurality of permanent magnets, the method comprising the steps:
   providing first and second magnetically conducting deflection elements; and
   placing the first and second magnetically conducting deflection elements in the magnetic rotary-encoder system such that (i) the first magnetically conducting deflection element longitudinally extends parallel to the machine shaft, is arranged radially between the machine shaft and the plurality of permanent magnets of the pole wheel, and is stationary and fixed in position relative to the plurality of permanent magnets and relative to the magnetic sensor; and (ii) the second magnetically conducting deflection element extends radially outwardly from the first magnetically conducting deflection element, and is stationary and fixed in position relative to the plurality of permanent magnets and relative to the magnetic sensor;
   wherein the first and second magnetically conducting deflection elements are formed and dimensioned such that the placing of the first and second magnetically conducting deflection elements in the magnetic rotary-encoder system can establish a measuring volume adjacent to the magnetic sensor and/or at least partially around the magnetic sensor when the rotary-encoder system is in use, which the measuring volume has a magnetic noise field less than the ambient magnetic noise field.

14. The apparatus of claim 1, wherein the first magnetically conducting deflection element and the second magnetically conducting deflection element are unitary with each other.

15. The method of claim 13, wherein the second magnetically conducting deflection element is connected to the first magnetically conducting deflection element, and wherein the second magnetically conducting deflection element extends in a direction of the rotational plane to a region below the magnetic sensor.

16. An apparatus comprising: a rotating machine shaft, a magnetic rotary-encoder sensor system, and a screening system for the magnetic rotary-encoder sensor system including a magnetic sensor, a pole wheel, and a pole-wheel carrier, wherein the pole wheel comprises in a circumferential direction a plurality of permanent magnets of alternating magnetic polarity, wherein the pole-wheel carrier is configured to be mounted to the rotating machine shaft extending axially, wherein the magnetic sensor is mounted relative to the machine shaft, in a rotational plane of the plurality of permanent magnets, and radially directly opposite to the plurality of permanent magnets, wherein the screening system comprises first and second magnetically conducting deflectors that are stationary relative to the plurality of permanent magnets and stationary relative to the magnetic sensor,
   wherein the first magnetically conducting deflector extends in a longitudinal direction parallel to the machine shaft, and is arranged radially between the machine shaft and the plurality of permanent magnets, and is spaced apart from the machine shaft and the pole wheel;
   wherein the second magnetically conducting deflector extends radially outwardly from the first magnetically conducting deflector; and
   wherein the first magnetically conducting deflector is disposed in a gap between the pole wheel and the rotating machine shaft such that the first magnetically conducting deflector is in spaced apart relation to the pole wheel and the rotating machine shaft.

17. A method of using the apparatus according to claim 1, comprising:
   exposing the first and second magnetically conducting deflection elements to the ambient magnetic noise field; and
   screening the magnetic sensor from the ambient magnetic noise field with the first and second magnetically conducting deflection elements by establishing the measuring volume adjacent to the magnetic sensor and/or at least partially around the magnetic sensor, such that the magnetic noise field of the measuring volume is less than the ambient magnetic noise field.

* * * * *